United States Patent [19]

Iwamura et al.

[11] Patent Number: 4,860,148

[45] Date of Patent: Aug. 22, 1989

[54] SEMICONDUCTOR INTEGRATED CIRCUIT DEVICE WITH A PROTECTIVE CIRCUIT

[75] Inventors: Masahiro Iwamura; Ikuro Masuda, both of Hitachi; Hideaki Uchida, Takasaki, all of Japan

[73] Assignee: Hitachi, Ltd., Tokyo, Japan

[21] Appl. No.: 37,851

[22] Filed: Apr. 13, 1987

[30] Foreign Application Priority Data

Apr. 14, 1986 [JP] Japan ................................. 61-84137

[51] Int. Cl.⁴ .............................................. H02H 3/24
[52] U.S. Cl. ......................................... 361/58; 361/91; 361/111; 307/111; 307/200.1
[58] Field of Search .................... 361/56, 58, 111, 118, 361/91, 110; 307/200 B, 571

[56] References Cited

U.S. PATENT DOCUMENTS

| 4,086,642 | 4/1978 | Yoshida et al. | 361/91 |
| 4,288,829 | 9/1981 | Tango | 361/91 |
| 4,456,939 | 6/1984 | Ozaki et al. | 361/91 |
| 4,517,618 | 5/1985 | Frank | 361/58 |
| 4,527,213 | 7/1985 | Ariizumi | 361/91 |
| 4,533,970 | 8/1985 | Brown | 361/58 |
| 4,555,741 | 11/1985 | Masaki | 361/58 |
| 4,594,630 | 6/1986 | Rabinowitz et al. | 361/58 |

Primary Examiner—A. D. Pellinen
Assistant Examiner—Jeffrey A. Gaffin
Attorney, Agent, or Firm—Antonelli, Terry & Wands

[57] ABSTRACT

A semiconductor integrated circuit device is provided with an input and/or an output terminal and at least one semiconductor device. The circuit has a resistor provided between the input terminal and/or the output terminal and one of the at least one semiconductor devices and an electronic switch connected in parallel with the resistor. The electronic switch is on-off controlled so as to exhibit a relatively low impedance when the semiconductor device is in operation and a relatively high impedance when the semiconductor device is not in operation. Thus, the semiconductor integrated circuit device is operable at a higher speed with an improved reliability and/or with controllable response characteristics, as compared with the conventional device.

15 Claims, 8 Drawing Sheets

SEMICONDUCTOR INTEGRATED CIRCUIT DEVICE WITH A PROTECTIVE CIRCUIT

BACKGROUND OF THE INVENTION

This invention relates to a semiconductor integrated circuit device and, more particularly, to a semiconductor integrated circuit device provided with a protective circuit against surge voltages.

Figure 1:
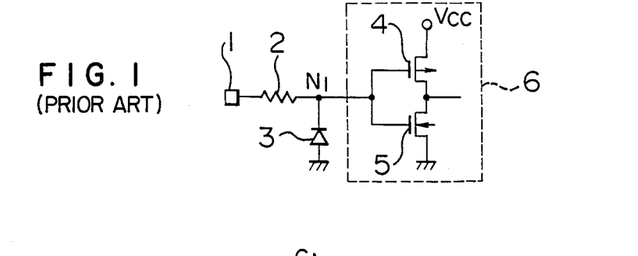
FIG. 1 is a circuit diagram showing an example of the prior art semiconductor IC device.

The construction indicated in FIG. 1 for the input section of a prior art semiconductor integrated circuit device is shown, e.g., in FIG. 1 of JP-A-No. 59-181044 (laid-open on Oct. 15, 1984).

In the figure, the reference numeral 1 indicates an input terminal; 2 a resistor; 1 a diode; 4 a PMOS; and 5 an NMOS. The PMOS 4 and the NMOS 5 constitute an input buffer circuit, which is a part of the semiconductor integrated circuit device, and the resistor 2 and the diode 3 constitute a protective circuit for the semiconductor integrated circuit device. This protective circuit is necessary to prevent that the transistors 4 and 5 from being destroyed by surge voltages due to electrostatic charge, etc. applied to the input terminal 1. The operation mode of this circuit is as follows.

When a positive surge voltage is applied to the input terminal 1, the diode 3 is broken down and a surge current flows from the input terminal 1 through the resistor 2 and the diode 3 to the ground, which keeps the potential at the node $N_1$ at a predetermined value and thus protects the transistors 4 and 5.

Next, when a negative surge voltage is applied to the input terminal 1, the diode 3 is turned on and a surge current flows from the ground through the resistor 2 to the input terminal, which keeps the potential at the node $N_1$ at a predetermined value and thus protects the transistors 4 and 5.

In the prior art circuit, when the resistance of the resistor 2 is augmented, the electrostatic breakdown voltage is increased, but at the same time the delay time due to the time constant determined by the parasitic capacitance as the node $N_1$ and the resistance of the resistor 2 is increased. To the contrary, if the resistance is reduced in order to ameliorate the speed, the electrostatic breakdown voltage is lowered and therefore it was impossible to reconcile high speed and high reliability.

Further, in the prior art circuit, the resistance of the resistor 2 was fixed at its fabrication and invariable, and thus it performed merely its function as a protective circuit.

SUMMARY OF THE INVENTION

An object of this invention is to provide a semiconductor integrated circuit device compatibly attaining both high speed operation and high reliability.

Another object of this invention is to provide a semiconductor integrated circuit device having a function to control response characteristics including the operation speed of the input/output section, etc. beside the protective function.

According to one aspect of this invention, a parallel circuit of a resistor and switching means is provided between the input and/or the output section. The switching means is so controlled that it has different resistances, depending on whether the semiconductor integrated circuit device is in operation or not. This arrangement is based on the inventors observations that it is when the semiconductor integrated circuit device is not in operation, (e.g., during testing, packaging, transportation, mounting on printed board, etc.) that the semiconductor integrated circuit device is subjected to the risk of electrostatic breakdown. In addition, the parallel circuit is so constructed that, when it is in operation, the resistance in the input section of a semiconductor integrated circuit device can be varied real time. Based on this, the parallel circuit can have useful functions other than merely being a protective circuit.

The switching means acts so as to increase the resistance of the parallel circuit stated above performing the protective function, when the semiconductor integrated circuit device is not in operation, and to reduce it satisfactorily, when the semiconductor integrated circuit device is in operation. Further, the resistance of the switching means is controlled by signals produced within the semiconductor integrated circuit device and/or signals coming from the outside thereof.

DESCRIPTION OF THE PREFERRED EMBODIMENTS

Hereinbelow some embodiments of this invention will be explained, referring to the drawings.

Figure 2:
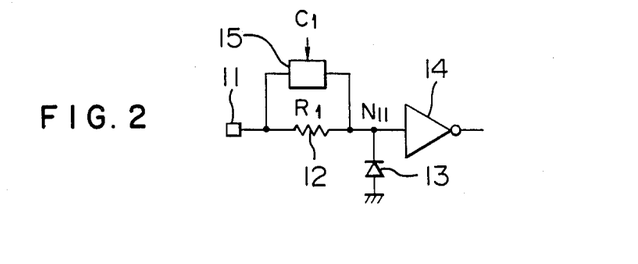
FIG. 2 is a circuit diagram showing an embodiment of the present invention.

FIG. 2 shows an embodiment of this invention. In the figure the reference numeral 11 indicates an input terminal and 12 represents a resistor connected between the input terminal 11 and an input buffer circuit 14, which is a part of the semiconductor integrated circuit device. The cathode of a diode 13 is connected with the junction $N_{11}$ between the resistor 12 and the input buffer circuit 14 and the anode thereof is connected with a common potential line. Switching means 15 is connected in parallel with the resistor 12. The resistor 12, the diode 13 and the switching means 15 constitute a protective circuit. The elements 12 to 15 are integrated on a same semiconductor substrate. The on-off operation of the switching means 15 is controlled by a control signal $C_1$. Usually a buffer circuit is one disposed for the purpose of transforming the operation level and/or transforming the impedance.

Figure 3A:
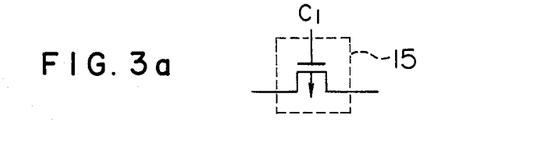
FIGS. 3a–3c are circuit diagrams showing some examples of the switching means which may be used in the present invention.
Figure 3B:
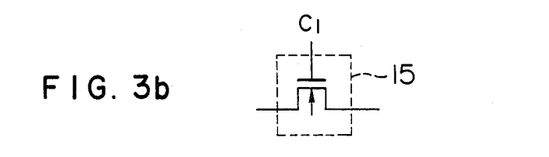
Figure 3C:
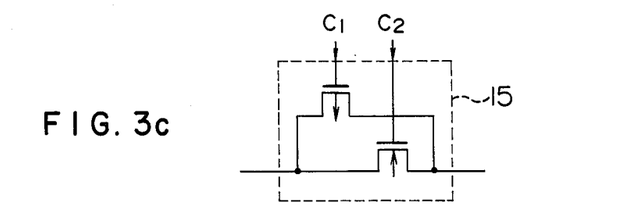

As examples of the switching means 15, there can be enumerated a circuit constituted by a PMOS transistor, as indicated in FIG. 3a, a circuit constituted by an NMOS transistor, as indicated in FIG. 3b, a circuit, in which a PMOS transistor and an NMOS transistor are connected in parallel, as indicated in FIG. 3c, a circuit constituted by bipolar transistors, a composite circuit, in which bipolar transistors and MOS transistors are combined, the last two being not shown in the figure, and so forth. In the circuit indicated in FIG. 3c, the on-off operation of the circuit is controlled by two control signals $C_1$ and $C_2$ and the ON-resistance is smaller than in the circuits shown in FIGS. 3a and 3b.

Further, as the semiconductor device or circuit included in the semiconductor integrated circuit device, there can be enumerated a circuit constituted by NMOS transistors, a circuit constituted by PMOS transistors, a circuit constituted by CMOS transistors, each of which consists of a PMOS and an NMOS, a circuit constituted by composite circuits consisting of bipolar transistors and MOS transistors, a circuit in which these various transistors coexist, and so forth. For the sake of convenience each of these are called "an internal circuit" hereinafter.

Now, the on-resistance of the switching means 15 being $r_S$, when it is switched off, the resistance between the input terminal 11 and the node $N_{11}$ is $R_i$, $R_i$ being the resistance of the resistor 12, and when it is switched on, the resistance is $$\frac{R_i \cdot r_s}{R_i + r_s}.$$

Consequently, by determining previously the value of $R_i$ so as to obtain a sufficiently high withstand voltage, when it is not in operation, where it runs the risk of surge voltages due to electrostatic charge and by turning on the switching means 15, when it is in operation, it is possible to change over the resistance between the input terminal 11 and the node $N_{11}$ to a sufficiently low value and to minimize the delay of signals due to the protective resistance and the parasitic capacitance at the node $N_{11}$. Consequently, according to this embodiment it is possible to compatibly attain both the increase of the surge voltage immunity voltage and the realization of the high speed operation, what was impossible according to the prior art techniques.

Figure 4:
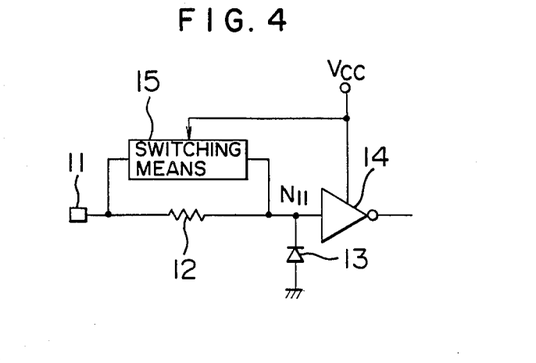
FIGS. 4–6 are circuit diagrams showing other embodiments of the present invention.

FIG. 4 shows another embodiment of this invention.

In this embodiment the switching means 15 is controlled by the voltage at the power supply terminal $V_{cc}$ or a signal generated on the basis thereof. That is, when no electric power is supplied to the terminal $V_{cc}$ (i.e. when the internal circuit is not in operation), the switching means 15 is turned off. Therefore the resistance of the switching means 15 is almost infinitely great and thus the resistor 12 designed so as to have a predetermined resistance and the diode 13 protect the input buffer circuit 14 against electrostatic surge voltages. Then, when electric power is supplied to the terminal $V_{cc}$ and the device is driven (when the internal circuit is in operation), the switching means 15 is turned on. Therefore it is possible to minimize the delay of signals, enabling a high speed operation by changing over the resistance between the input terminal and the node $N_{11}$ to a low value.

Figure 5:
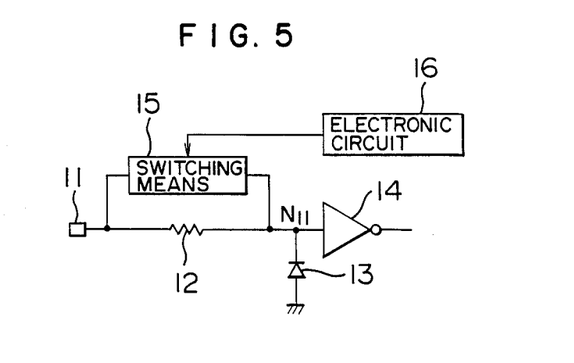

FIG. 5 shows still another embodiment of this invention.

Figure 7:
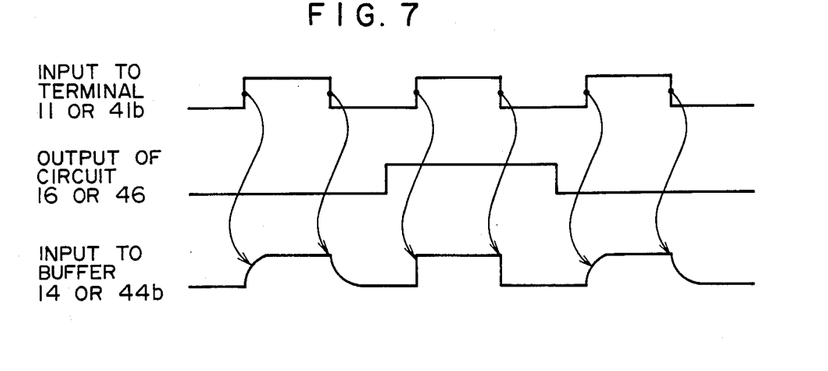
FIG. 7 is a waveform diagram illustrating the operation of the embodiments shown in FIGS. 5 and 6.

In this embodiment the switching means 15 is controlled by an electronic circuit 16 in the internal circuit. That is, also when the device is in operation, a desired resistance can be obtained dynamically between the input terminal 11 and the node $N_{11}$ by on-off controlling the switching means 15 at a predetermined point of time. By effectively utilizing this function, it is possible e.g. to start a predetermined operation of the internal circuit, introducing an input signal from the input terminal 11 in the internal circuit with a high speed and to retard the response to the input signal (noise eliminating effect), augmenting the resistance between the input terminal 11 and the node $N_{11}$ during a predetermined period of time after the start of the processing in the internal circuit, and to have various functions other than the original aimed function of the protective circuit, such as that of a circuit retarding only the front edge of the input signal, that of a pulse stretch circuit retarding only the rear edge of the input signal, etc. Examples of waveforms of signals observed at some of the main portions of the device shown in FIG. 5 are illustrated in FIG. 7.

Figure 6:
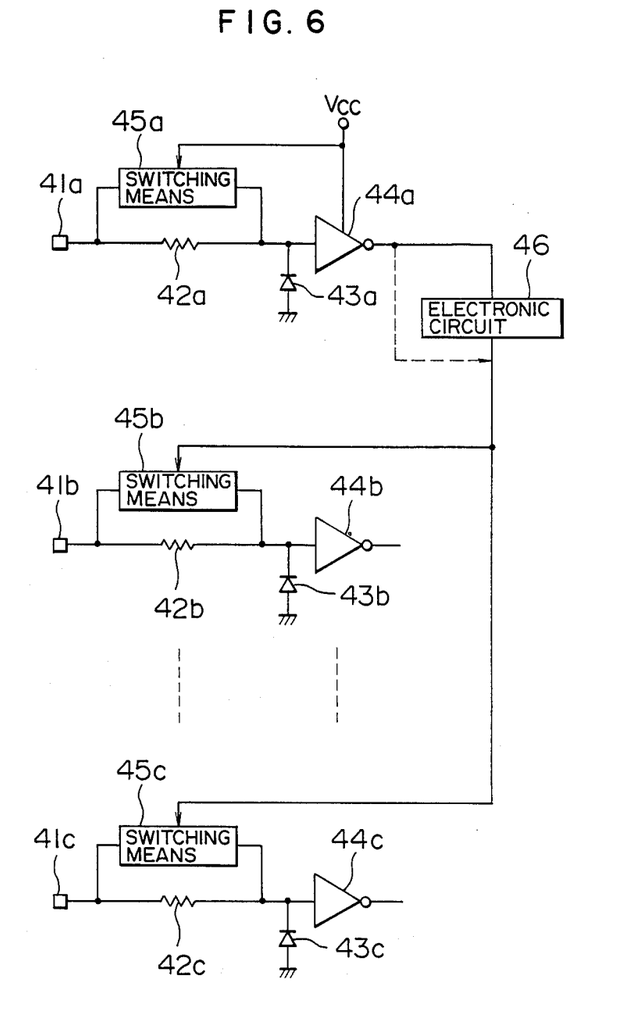

FIG. 6 shows still another embodiment of this invention. In this embodiment the semiconductor integrated circuit device comprises a plurality of input terminals 41a–41c, a plurality of input buffer circuits 44a–44c, a plurality of resistors 42a–42c, a plurality of diodes 43a–43c, in each of which the cathode is connected to the junction between one of the resistors 42a–42c and one of the buffer circuits 44a–44c and the anode is connected with a common potential line, a plurality of switching means 45a–45c, each of which is connected to one of the resistors 42a–42c, and an electronic circuit 46 in the internal circuit. This device is characterized in that the switch means 45a is controlled by the voltage at the power supply terminal $V_{cc}$ or a signal generated on the basis thereof and that of the contrary the switch means 45b and 45c are controlled directly by the output of the input buffer 44a or by the output of the electronic circuit 46 in the internal circuit, which operates, responding to the output of the input buffer circuit 44a. That is, the signals at the input terminal 41a are supplied from the outside of the chip as signals for controlling the switch means 45b and 45c.

Contrarily to the fact that, in a prior art input buffer circuit, characteristics of the input buffer circuit are fixed at the moment where the semiconductor chip is accomplished, according to this embodiment, it is possible to obtain an effect that characteristics of the input buffer circuit can be dynamically programed by means of control signals coming from the outside of the device, when it is in operation after the chip has been accomplished. Examples of waveforms of signals observed at some of the main portions of the device shown in FIG. 6 are illustrated in FIG. 7.

Figure 8:
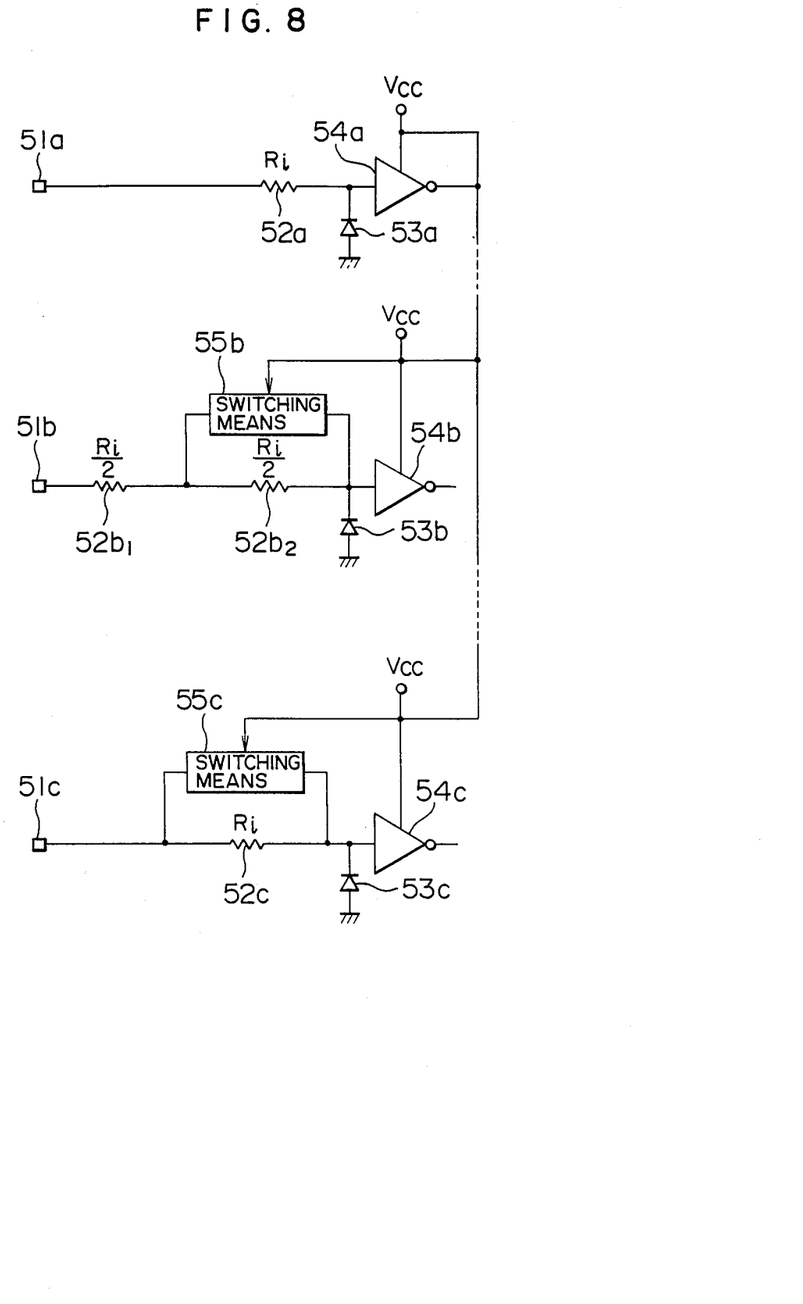
FIGS. 8 and 9 are circuit diagrams showing other embodiments of the present invention.

FIG. 8 shows still another embodiment of this invention.

In this embodiment, just as in the embodiment illustrated in FIG. 5, the semiconductor integrated circuit device comprises a plurality of input terminals 51a–51c, a plurality of input buffer circuits 54a–54c and a plurality of diodes 53a–53c, but it differs therefrom in that a resistor 52a having a reference $R_i$ is connected between the input terminal 51a and the input buffer circuit 54a, that two resistors $52b_1$ and $52b_2$ connected in series, each of which has a resistance $R_i/2$, are connected between the input terminal 51b and the input buffer circuit 54b, that a resistor 52c having a resistance $R_i$ is connected between the input terminal 51c and the input buffer circuit 54c, that switching means 55b and 55c are connected in parallel with the resistors 52b₂ and 52c, respectively, that no switching means is connected to the resistor 52a and that the switching means 55b and 55c are controlled by the voltage at the power supply terminal $V_{cc}$ or a signal generated on the basis thereof. That is, when no electric power is supplied to the power supply terminal $V_{cc}$ and the device doesn't operate (the internal circuit is not in operation), the electronic switching means 55b and 55c are turned off and all the resistances of the resistors are $R_1$. When electric power is supplied to the power supply terminal $V_{cc}$, the electronic switching means 55b and 55c are turned on. Consequently the input resistance of the input buffer circuit 54b is $R_i/2$ and that of the input buffer circuit 54c is zero, (supposing that the on-resistances of the electronic switching means 55b and 55c are zero). That is, the three input circuits act as protective circuits for the input buffer circuits 54a–54c, respectively, and have different input time constants so that they operate with different speeds. Such a function is useful, when it is utilized for controlling the skew among a plurality of signals at the design of electronic devices.

Figure 9:
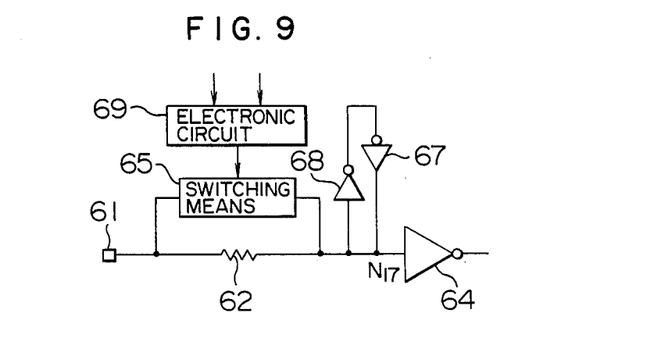

FIG. 9 shows still another embodiment of this invention.

Figure 10:
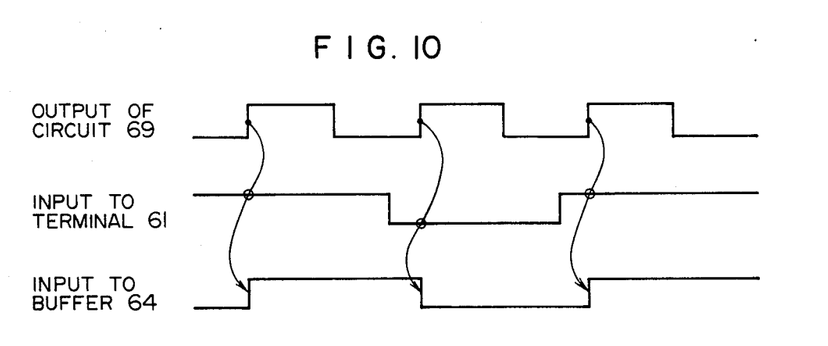
FIG. 10 is a waveform diagram illustrating the operation of the embodiment shown in FIG. 9.

In the figure, the reference numerals 67 and 68 represent inverter circuits, which act as positive feedback latches connected with a node $N_{17}$. Numeral 69 is an electronic circuit in the internal circuit for controlling a switching means 65, which is connected in parallel with a resistor 62 connected between the input teminal 61 and the input buffer circuit 64. The electronic circuit 69 may be constituted by, for example, an R-S flip-flop circuit. At first the switch means 65 is turned on and the signal at the input terminal 61 is taken in to the node $N_{17}$. Then, the switch means 65 is turned off by means of the output of the electronic circuit 69. At this time, if the resistance of the resistor 62 is set at a sufficiently great value, even when the signal level at the input terminal 61 varies, it may be possible that this variation is not transmitted to the node $N_{17}$. In this way, the input buffer circuit 64 acts as an input buffer circuit with a protective circuit provided with a latch function. The input buffer circuit with the latch function disclosed in this embodiment produces an effect to transmit more rapidly the signal at the input terminal 61 to the internal circuit, because no extra circuit steps are added thereto as compared with the prior art device, in which a latch circuit is added to the input buffer circuit 64 on the output side. In addition, an effect can be obtained to be able to select freely the presence or the absence of the latch function by varying the control method of the electronic circuit 69. Examples of waveforms of signals observed at some of the main portions of the device shown in FIG. 9 are illustrated in FIG. 10.

Figure 11:
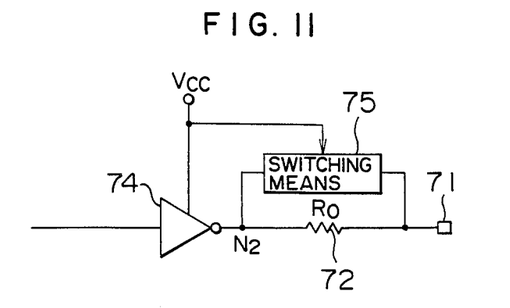
FIGS. 11 and 12 are circuit diagrams showing other embodiments of the present invention.

FIG. 11 shows still another embodiment of this invention.

In the figure the reference numeral 71 is an output terminal; 72 is a resistor disposed between the output terminal 71 and an output buffer circuit 74; 74 is the output buffer circuit; and 75 is switching means connected in parallel with the resistor 72.

In this embodiment the switching means 75 is controlled by the voltage at the power supply terminal $V_{cc}$ or a signal generated on the basis thereof. When the device is not in operation, it is turned off so as to protect the output buffer circuit 74, which is a part of the internal circuit against surge voltages applied to the output terminal 71, by means of the resistance $R_o$ of the resistor 72. During an operation, where the voltage is established at the power supply terminal $V_{cc}$ (when the internal circuit is in operation), the switch 75 is turned on and bridges the node $N_2$ and the terminal 71 with a low resistance. In this way the output buffer circuit 74 can operate with a high speed without being influenced by the resistor 72.

Figure 12:
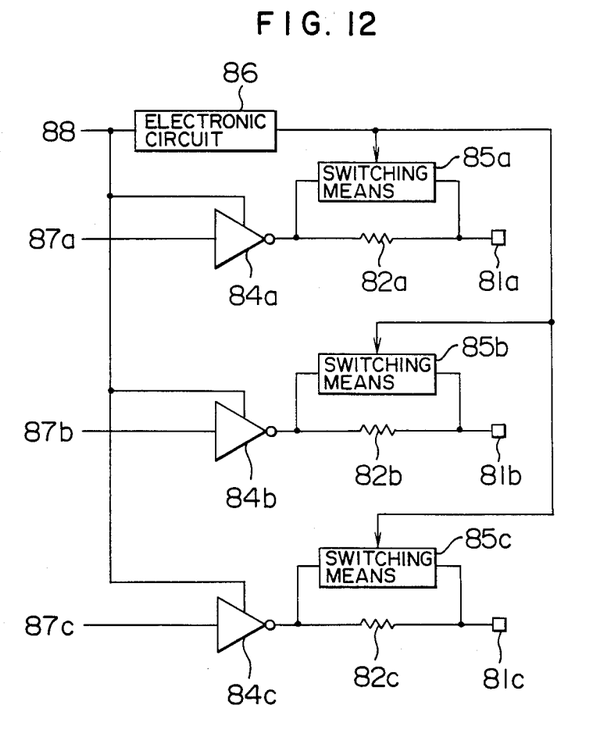

FIG. 12 shows still another embodiment of this invention.

Figure 13:
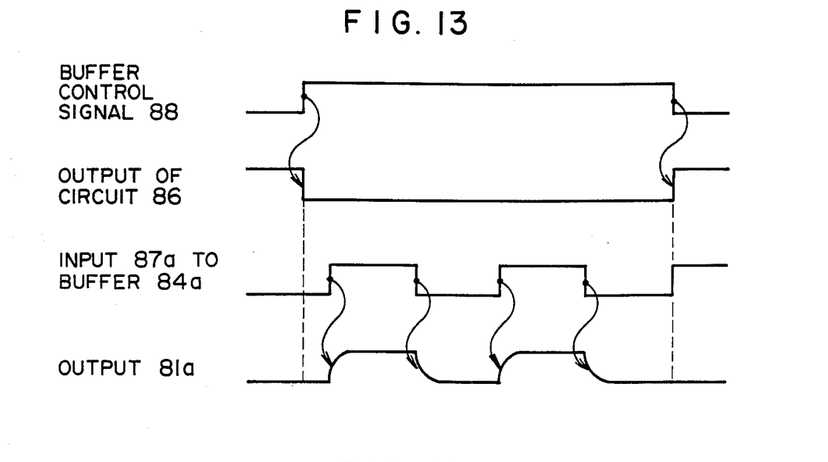
FIG. 13 is a waveform diagram illustrating the operation of the embodiment shown in FIG. 12.

In the figure, reference numerals 84a, 84b, 84c represent tri-state output buffer circuits. Resistors 82a–82c are connected between the buffer circuits 84a–84c and output terminals 81a–81c, respectively. The buffer circuits 84a–84c respond to input signals 87a, 87b, 87c at the output terminals 81a, 81b, 81c corresponding thereto under the control of a buffer control signal 88. 86 represents an electronic circuit included in the internal circuit and operating under the control of the control signal 88 and its output controls switching means 85a, 85b, 85c connected in parallel to the resistors 85a, 85b, 85c, respectively. The resistors 82a, 82b, 82c act, in this case, as damping resistors. In this embodiment the swtiching means 85a, 85b, 85c are normally turned on. When the buffer control signal 88 is applied, i.e. when the output buffer circuits 84a, 84b, 84c are driven at the same time, the switching means 85a, 85b, 85c are turned off. In this way the output resistance is increased and thus the skew rate dv/dt of the output voltage v at the output terminals 81a, 81b, 81c is suppressed. Consequently an effect can be obtained such that noises proportional to dv/dt produced on the power supply line and the group line due to the simultaneous drive of a number of output buffer circuits can be suppressed. Examples of waveforms of signals observed at some of the main portions of the device shown in FIG. 12 are illustrated in FIG. 13.

Figure 14:
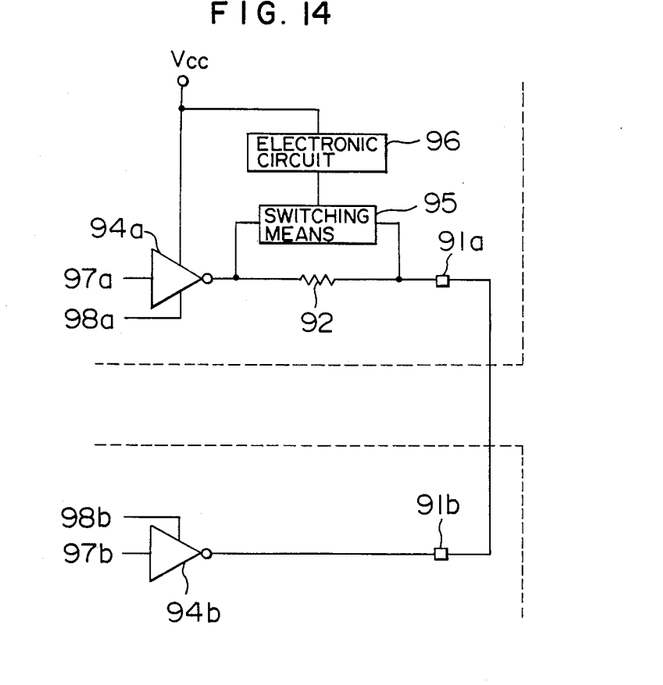
FIG. 14 is a circuit diagram showing another embodiment of the present invention.

FIG. 14 shows still another embodiment of this invention.

In the figure the reference numerals 94a and 94b represent tri-state output buffer circuit disposed on separate chips and the output of each of them is connected in common at the exterior through an output terminal 91a or 91b. In such a circuit, both buffer control signals 98a and 98b may be active during a certain period of time, after the power supply has been switched on. At this time the outputs of the output buffer circuits 94a and 94b are short-circuited and thus an excessive current flows therethrough, what gives rise to fusing of wiring and destruction of elements.

A resistor 92, switching means 95 and an electronic circuit 96 provide an effective solution of these problematical points. The electronic circuit 96 acts so that the switch means 95 is kept turned off during a certain period of time ($t_0$) after the switch-on of the power supply and it is turned on thereafter.

Figure 15:
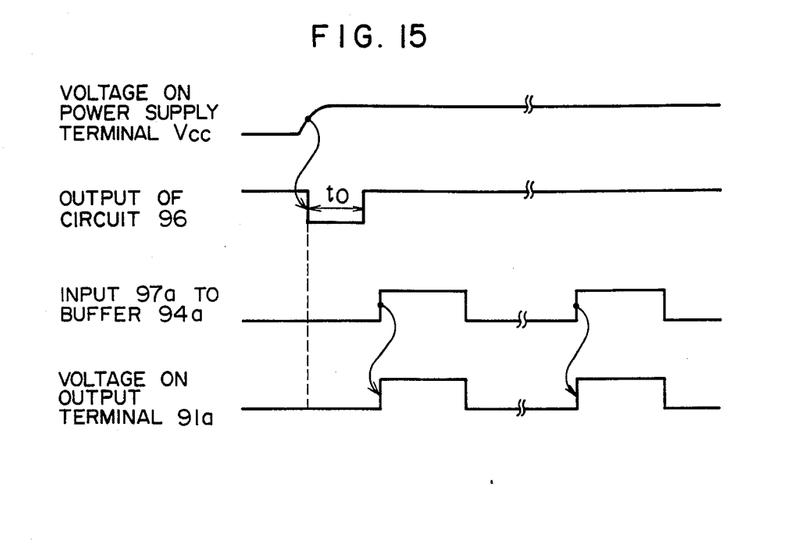
FIG. 15 is a waveform diagram illustrating the operation of the embodiment shown in FIG. 14.

Therefore the short-circuit current is restricted by the resistor 92 during a certain period of time just after the switch-on of the power supply and thereafter, in the stationary state, the output resistance is reduced so that the device can be driven with a high speed. Examples of waveforms of signals observed at some of the main portions of the device shown in FIG. 14 are illustrated in FIG. 15.

In the above-described embodiment, the switch means 15, 54a–54c, 55b–55c, 65, 75, 85a–85c, 95 may be constituted by one or more of the structures shown in FIGS. 3a–3c or any of the structure referred to above in connection with FIGS. 3a–3c, in accordance with the construction of the semiconductor IC devices. Further, the electronic circuits in the internal circuits may be constituted by any circuit such as a gate circuit, a flip-flop circuit or the like which is capaable of generating a signal having at least two logical levels.

Figure 16:
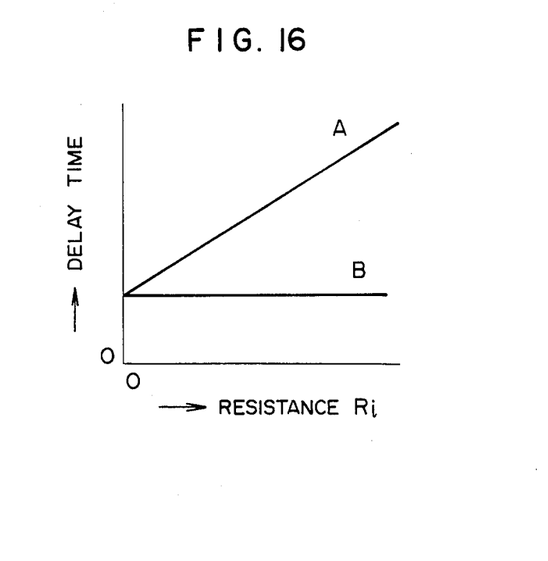
FIG. 16 is a graph illustrating a functional effect of the present invention.

FIG. 16 illustrates simulation results for the embodiment indicated in FIG. 4 in order to verify the effect of this invention. In the figure the straight line A indicates characteristics of a prior art input buffer circuit and the straight line B shows those of the input buffer circuit according to the embodiment of this invention. As can be seen clearly from the figure, in the prior art circuit, the delay time becomes longer and high speed operation is impossible with augmenting resistance, in order to increase the reliability. To the contrary, in the circuit according to the embodiment of this invention, even if the resistance is increased, the delay time is not elongated and the high speed operation is always possible.

As clearly understood in the explanation described above, according to this invention, since the high reliability of elements against electrostatic breakdown and the high speed operation of the circuit can be reconciled, an effect can be obtained that a semiconductor integrated circuit of high speed and high reliability can be realized.

We claim:

1. A semiconductor integrated circuit device including a signal input terminal, at least one semiconductor device and a power supply terminal therefor, comprising:
   a resistor connected between said signal input terminal and one of said at least one semiconductor device; and
   switching means connected to parallel with said resistor and arranged to be operable responsive to a control signal to be applied thereto so that the parallel connection of said resistor and said switching means exhibits a relatively low impedance when said at least one semiconductor device is in operation by powering through said power supply terminal and a relatively high impedance when said at least one semiconductor device is not in operation.

2. A semiconductor integrated circuit device according to claim 1, in which said switching means is electrically connected with said power supply terminal so that said control signal is produced on the basis of the voltage on said power supply terminal to on-off control said switching means with said control signal.

3. A semiconductor integrated circuit device according to claim 1, in which said switching means is electrically connected with one of said at least one semiconductor device so that said control signal is produced on the basis of the output of said one semiconductor device to on-off control said switching means with said control signal.

4. A semiconductor integrated circuit device according to claim 1, further comprising a diode having its cathode connected with the junction of said resistor and said one semiconductor device and its anode connected with a common potential line.

5. A semiconductor integrated circuit device according to claim 1, in which said one semiconductor device is an input buffer circuit.

6. A semiconductor integrated circuit device according to claim 5, further comprising a latch circuit connected between said buffer circuit and the junction of said resistor and said switching means.

7. A semiconductor integrated circuit device including at least one semiconductor device, comprising:
   a plurality of signal input terminals;
   a plurality of input buffer circuits each for receiving an input signal from a different one of said signal input terminals associated therewith; and
   a parallel connection of a resistor and switching means provided between each of said signal input terminals and the associated input buffer circuit, one of said switching means being electrically connected with said power supply terminal so that said one switching means is on-off controlled by a control signal produced on the basis of the voltage on said power supply terminal, with the other switching means being electrically connected with the input buffer circuit connected with said one switching means so that they are on-off controlled by another control signal produced on the basis of the output of said input buffer circuit connected with said one switching means.

8. A semiconductor integrated circuit device according to claim 7, in which the output of said input buffer circuit connected with said one switching means is connected with one of said at least one semiconductor device to produce said another control signal.

9. A semiconductor integrated circuit device including at least one semiconductor device and a power supply terminal therefor, comprising:
   a plurality of signal input terminals;
   a plurality of input buffer circuits each for receiving an input signal from a different one of said signal input terminals associated therewith;
   a resistor provided between each of said signal input terminals and its associated input buffer circuit, at least one of said resistors having a resistance different from that of the other resistors;
   at least one switching means each provided for a parallel connection with one of said resistors and electrically connected with said power supply terminal so that said switching means is on-off controlled by a control signal produced on the basis of the voltage on said power supply terminal; and
   a plurality of diodes each having its cathode connected with the junction of a different one of said resistors and its associated input buffer circuit and its anode connected with a common potential line.

10. A semiconductor integrated circuit device including at least one semiconductor device, a power supply terminal therefor and a signal output terminal, comprising:
    a resistor connected between said signal output terminal and one of said at least one semiconductor device; and
    switching means connected in parallel with said resistor and arranged to be operable responsive to a control signal to be applied thereto so that the parallel connection of said resistor and said switching means exhibits a relatively low impedance when said at least one semiconductor device is in operation by powering through said power supply terminal and a relatively high impedance when said at least one semiconductor device is not in operation.

11. A semiconductor integrated circuit device according to claim 10, in which said switching means is electrically connected with said power supply terminal so that said control signal is produced on the basis of the voltage on said power supply terminal to on-off control said switching means with said control signal.

12. A semiconductor integrated circuit device according to claim 10, in which said switching means is electrically connected with one of said at least one semiconductor device so that said control signal is produced on the basis of the output of said one semiconductor device to on-off control said switching means with said control signal.

13. A semiconductor integrated circuit device according to claim 10, in which said one semiconductor device is an output buffer circuit.

14. A semiconductor integrated circuit device including at least one semiconductor device, comprising:
   a plurality of output terminals;
   a plurality of output buffer circuits each for receiving a different input signal to deliver an output signal to a different one of said output terminals associated therewith; and
   a parallel connection of a resistor and switching means provided between each of said output terminals and the associated buffer circuit, each of said switching means being electrically connected with one of said at least one semiconductor device so that said switching means are on-off controlled by a control signal produced on the basis of the output of said one semiconductor device, said one semiconductor device and said output buffer circuits being arranged to receive a common input signal.

15. A protective circuit for a semiconductor integrated circuit device including a signal input terminal and a signal output terminal and at least one semiconductor device, comprising:
   a resistor provided between at least one of said signal input terminal and signal output terminal and one of said at least one semiconductor device; and
   switching means connected in parallel with said resistor and arranged so as to be operable responsive to a control signal to be applied thereto so that the parallel connection of said resistor and said switching means exhibits a relatively low impedance when said at least one semiconductor device is in operation by powering through said power supply terminal and a relatively high impedance when said at least one semiconductor device is not in operation,
   said protective circuit being formed on the same chip as said semiconductor integrated circuit device.

* * * * *